United States Patent
Kodama et al.

(10) Patent No.: US 8,110,413 B2
(45) Date of Patent: Feb. 7, 2012

(54) MASK PATTERN VERIFICATION APPARATUS, MASK PATTERN VERIFICATION METHOD AND METHOD OF FABRICATING A SEMICONDUCTOR DEVICE

(76) Inventors: Chikaaki Kodama, Kanagawa-ken (JP); Takanori Urakami, Kanagawa-ken (JP); Nozomu Furuta, Kanagawa-ken (JP); Shunsuke Kagaya, Kanagawa-ken (JP)

( * ) Notice: Subject to any disclaimer, the term of this patent is extended or adjusted under 35 U.S.C. 154(b) by 0 days.

(21) Appl. No.: 12/880,487

(22) Filed: Sep. 13, 2010

(65) Prior Publication Data
US 2011/0086515 A1      Apr. 14, 2011

(30) Foreign Application Priority Data
Oct. 13, 2009   (JP) .............................. P2009-235982

(51) Int. Cl.
   H01L 21/00    (2006.01)
   G06F 19/00    (2011.01)
   H01R 43/00    (2006.01)
(52) U.S. Cl. .................... 438/7; 257/E21.023; 700/121; 29/825
(58) Field of Classification Search ................. 700/121; 438/7; 257/E21.023; 29/825
See application file for complete search history.

(56) References Cited

U.S. PATENT DOCUMENTS

| | | | |
|---|---|---|---|
| 6,952,818 B2 | 10/2005 | Ikeuchi | |
| 7,694,267 B1* | 4/2010 | Ye et al. | 716/53 |
| 2008/0072207 A1* | 3/2008 | Verma et al. | 716/21 |
| 2010/0081294 A1* | 4/2010 | Ogawa et al. | 438/795 |
| 2010/0115765 A1* | 5/2010 | Hamamoto | 29/825 |
| 2010/0180253 A1* | 7/2010 | Ying | 716/21 |

* cited by examiner

*Primary Examiner* — William D Coleman
(74) *Attorney, Agent, or Firm* — Oblon, Spivak, McClelland, Maier & Neustadt, L.L.P.

(57) ABSTRACT

In one embodiment, a mask pattern verification apparatus is disclosed. The mask pattern verification apparatus can include a library registration portion registered a clean circuit pattern, a memory portion saved a design circuit pattern, a verification circuit pattern, a verification mask pattern, and a verification wafer pattern, a mask verification portion performing mask verification to the verification mask pattern, a lithography verification portion performing lithography verification to the verification wafer pattern, and a CPU including a library registration circuit registering the clean circuit pattern to the library registration portion, a pattern matching circuit verifying the clean circuit pattern being set or not in the design circuit pattern, a verification pattern extraction circuit extracting the verification circuit pattern from the design circuit pattern, an OPC circuit performing OPC to the verification circuit pattern, a mask verification circuit controlling the mask verification portion, and a lithography verification circuit controlling the lithography verification portion.

17 Claims, 5 Drawing Sheets

MASK PATTERN VERIFICATION APPARATUS, MASK PATTERN VERIFICATION METHOD AND METHOD OF FABRICATING A SEMICONDUCTOR DEVICE

CROSS REFERENCE TO RELATED APPLICATION

This application is based upon and claims the benefit of priority from prior Japanese Patent Application No. 2009-235982, filed on Oct. 13, 2009, the entire contents of which are incorporated herein by reference.

FIELD

Exemplary embodiments described herein generally relate to a mask pattern verification apparatus, a mask pattern verification method, and a method of fabricating a semiconductor device using the mask pattern verification method.

BACKGROUND

In recently years, forming in fidelity a fine circuit pattern on a wafer by optical exposure have progressively been difficult with accompanying miniaturization of a semiconductor device.

A correction amount in transferring the circuit pattern in a mask to a surface of the wafer for improvement of the circuit pattern fidelity is preliminarily estimated in the circuit pattern in the mask to be incorporated in the technique mentioned above. The process mentioned above is optical proximity correction which is called OPC hereinafter.

A large amount of time is consumed in verification of forming the mask pattern such as mask verification, lithography verification or the like for improving a device yield which is a ratio of good chips per wafer with companying highly-developed semiconductor production technology. Therefore, a problem in which verification turn around time called verification TAT hereinafter is increased is generated.

An OPC non-adaptation pattern and the correction method, for example, are saved in a library. In the method, a circuit pattern newly input in a verification apparatus is matched with the OPC non-adaptation pattern. In such a manner, verification TAT is intended to be shortened.

Here, the OPC non-adaptation pattern is defined as a circuit pattern estimated to be judged as OPC non-adaptation or a circuit pattern judged as OPC non-adaptation in production verification.

There are infinite kinds of OPC non-adaptation patterns, however, the OPC non-adaptation patterns which can be saved in the library remains finite.

Accordingly, the OPC non-adaptation patterns not to be set in the library may set to be in the circuit patterns input into the verification apparatus.

As a result, whole circuit patterns input into the verification apparatus has a necessity to be again verified. Therefore, verification TAT may be likely not to be shortened.

Further, verification TAT is increased with accompanying enlargement and complexity of circuits in the semiconductor device in recent years.

Accordingly, it is desirable to be realized the mask pattern verification apparatus and the mask pattern verification method which are capable of shorten the verification TAT and a method of fabricating a semiconductor device using the mask pattern verification method.

DETAILED DESCRIPTION

Figure 1:
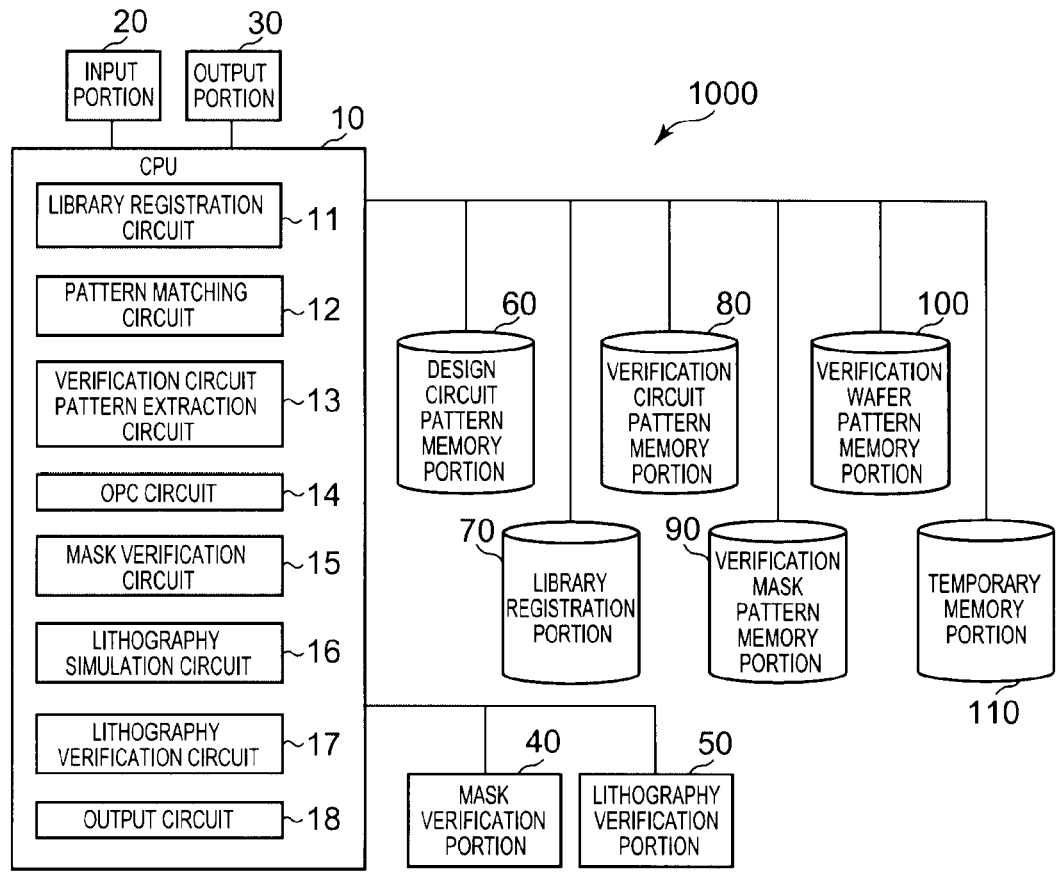
FIG. 1 is a block diagram showing a verification apparatus which performs a mask pattern verification method according to a first embodiment.

In one embodiment, a mask pattern verification apparatus is disclosed. The mask pattern verification apparatus can include a library registration portion resisted a clean circuit pattern, a memory portion saved a design circuit pattern, a verification circuit pattern, a verification mask pattern, and a verification wafer pattern, a mask verification portion performing mask verification to the verification mask pattern, a lithography verification portion performing lithography verification to the verification wafer pattern, and an CPU including a library registration circuit resisting the clean circuit pattern to the library registration portion, a pattern matching circuit verifying the clean circuit pattern being set or not in the design circuit pattern, a verification pattern extraction circuit extracting the verification circuit pattern from the design circuit pattern, an OPC circuit performing OPC to the verification circuit pattern, a mask verification circuit controlling the mask verification portion, and a lithography verification circuit controlling the lithography verification portion.

Embodiments of the present invention will be described below in detail with reference to the attached drawings mentioned above.

Throughout the attached drawings, similar or same reference numerals show similar, equivalent or same components.

First Embodiment

First, a mask pattern verification apparatus according to a first embodiment are described as reference to FIG. 1. FIG. 1 is a block diagram showing a verification apparatus which performs a mask pattern verification method according to the first embodiment.

<Verification Apparatus>

As shown in FIG. 1, a mask pattern verification apparatus 1000 in the first embodiment is constituted with a central processing unit 10 (called a CPU hereafter), an input portion 20, an output portion 30, a mask verification portion 40, a lithography verification portion 50, a design circuit pattern memory portion 60, a library registration portion 70, a verification circuit pattern memory portion 80, a verification mask pattern memory portion 90, a verification wafer pattern memory portion 100, and a temporary memory pattern portion 110.

The CPU 10 includes a library registration circuit 11, a pattern matching circuit 12, a verification circuit pattern extraction circuit 13, an OPC circuit 14, a mask verification circuit 15, a lithography simulation circuit 16, a lithography verification circuit 17, and an output circuit 18.

A clean circuit pattern is registered in the library registration portion 70 by the library registration circuit 11. Here, the clean circuit pattern defined as a circuit pattern in which a mask pattern is satisfied a mask rule and has not a hot spot (called a clean mask pattern hereinafter) after OPC. A shape of the circuit pattern may be arbitrary.

A kind of clean circuit patterns or plural kinds of the clean circuit patterns which are resisted may be available. Here, the mask rule is a rule for restriction of fabricating the mask.

The pattern matching circuit 12 verifies that a circuit pattern matches or not with the clean circuit pattern in the design circuit pattern saved in the design circuit pattern memory portion 60. Specifically, the pattern matching circuit 12 read out the design circuit pattern in the design circuit pattern memory portion 60 input by the input portion 20 to the temporary memory pattern portion 110. The pattern matching circuit 12 searches that the clean circuit pattern registered in the library registration portion 70 is set or not in the design circuit pattern. When the clean circuit pattern is set in the design circuit pattern by the search, a verification circuit pattern mentioned below which is an object for OPC is registered in the pattern memory portion 80 by the verification circuit pattern extraction circuit 13 mentioned below.

Further, when the plural kinds of the clean circuit patterns are registered in the library registration portion 70, only one kind of the clean circuit pattern is set or not may be verified or each of the plural kinds of the clean circuit patterns is set or not may be verified.

Further, the verification circuit pattern extraction circuit 13 extracts a circuit pattern objected to the OPC from the design circuit patterns (called a verification circuit pattern hereinafter). When the clean circuit pattern registered in the library registration portion 70 is set in the design circuit pattern of the design circuit pattern memory portion 60 in matching by the pattern matching circuit 12, next steps mentioned below are carried out. A reference circuit pattern, which is an area subtracted a periphery portion having a prescribed width from the clean circuit pattern, is extracted on the design circuit pattern, and the circuit pattern subtracted the reference circuit pattern from the design circuit pattern extracts as the verification circuit pattern to save in the verification circuit pattern memory portion 80.

When some kinds of the clean circuit patterns are set in the design circuit pattern, each of the reference circuit pattern is extracted in the verification circuit pattern memory portion 80. The circuit pattern is extracted from the design circuit pattern as the verification circuit pattern by the verification circuit pattern extraction circuit 13, and is saved in the verification circuit pattern memory portion 80.

Figure 2:
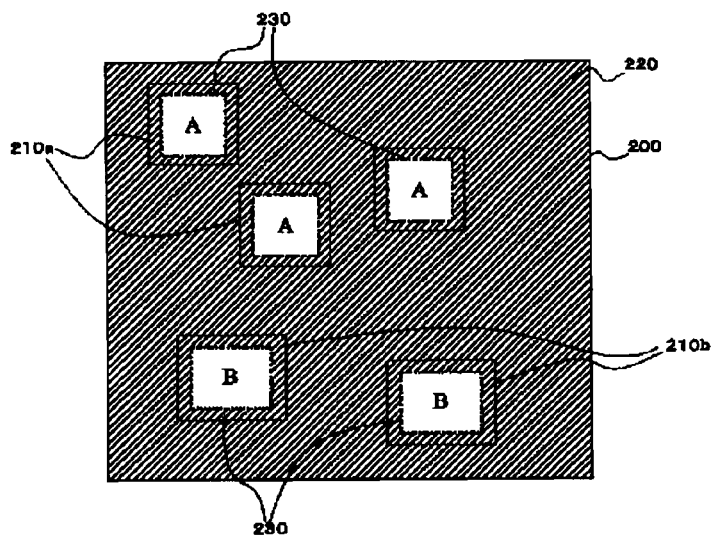
FIG. 2 is a conceptual diagram showing a circuit pattern saved in a verification circuit pattern memory portion according to the first embodiment.

FIG. 2 is a conceptual diagram showing a circuit pattern saved in the verification circuit pattern memory portion according to the first embodiment. For example, as shown in FIG. 2, two kinds of a clean circuit pattern A210*a* and a clean circuit pattern B210*b* are set in a design circuit pattern 200. The clean circuit patterns A210*a* are set to be three and the clean circuit pattern B210*b* are set to be two. In this case, a verification circuit pattern 220, which is a portion with diagonal lines in FIG. 2, is saved in the verification circuit pattern memory portion 80 on a basis of reference circuit patterns 230.

The OPC circuit 14 performs an OPC treatment to the verification circuit pattern (called a verification mask pattern herein after). The verification circuit pattern is saved in the verification mask pattern memory portion 90 by using the output circuit 18 mentioned below, after the OPC treatment.

The mask verification circuit 15 verifies correctness of the verification mask pattern and extracts a hot spot by controlling the mask verification portion 40. Namely, the mask verification circuit 15 verifies the correction is right or not in a range of mask and process limiting values which are preliminarily determined. The verification mentioned above is called mask verification in which the right or not is verified by using mask rule check (MRC) or the like.

The lithography simulation circuit 16 performs lithography simulation to the verification mask pattern adapted to the mask verification readout by the output circuit mentioned below.

The verification mask pattern (called verification wafer pattern hereinafter) after performing the lithography simulation is saved in the verification wafer pattern memory portion 100.

The lithography verification circuit 17 analyzes and extracts the hot spot originated from a defect to the verification wafer pattern readout from the output circuit 18 (called lithography verification hereinafter).

The readout circuit 18 readouts the verification mask pattern and the verification wafer pattern mentioned above, saves each of them in the verification mask pattern memory portion 90 and the verification wafer pattern memory portion 100, respectively.

The input portion 20 can perform various kinds of input commands and is constituted with a keyboard, a mouse, an image input portion or the like.

The output portion 30 can represent various kinds of images such as an initial image, a processed image or the like corresponding to the various kinds of input commands, and is constituted with a display or the like.

The temporary memory pattern portion 60 act as a working memory when the CPU 10 starts the operation, for example, is constituted with RAM.

<Mask Pattern Verification Method>

Figure 3:
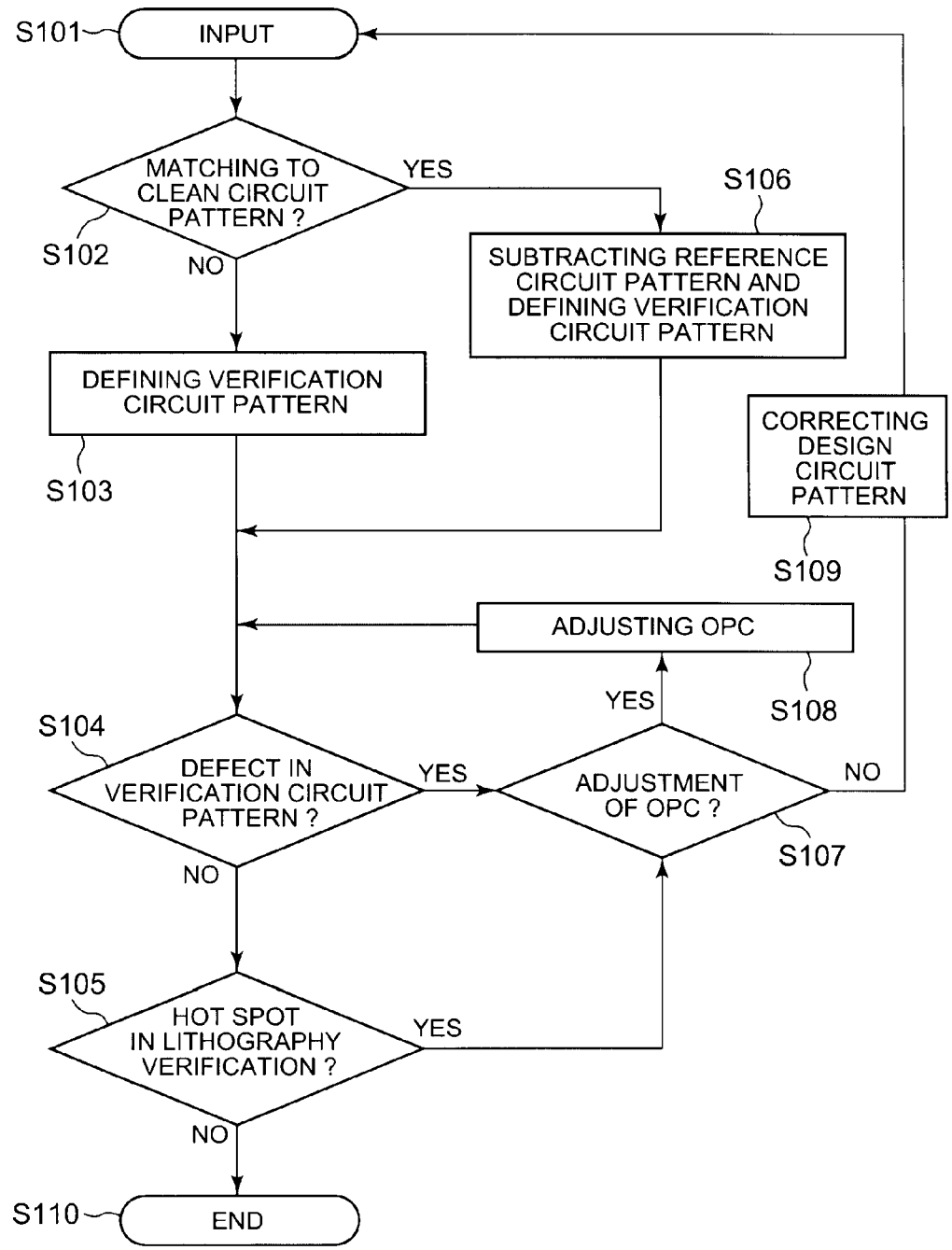
FIG. 3 is a flow chart showing a mask pattern verification method according to the first embodiment.
Figure 4:
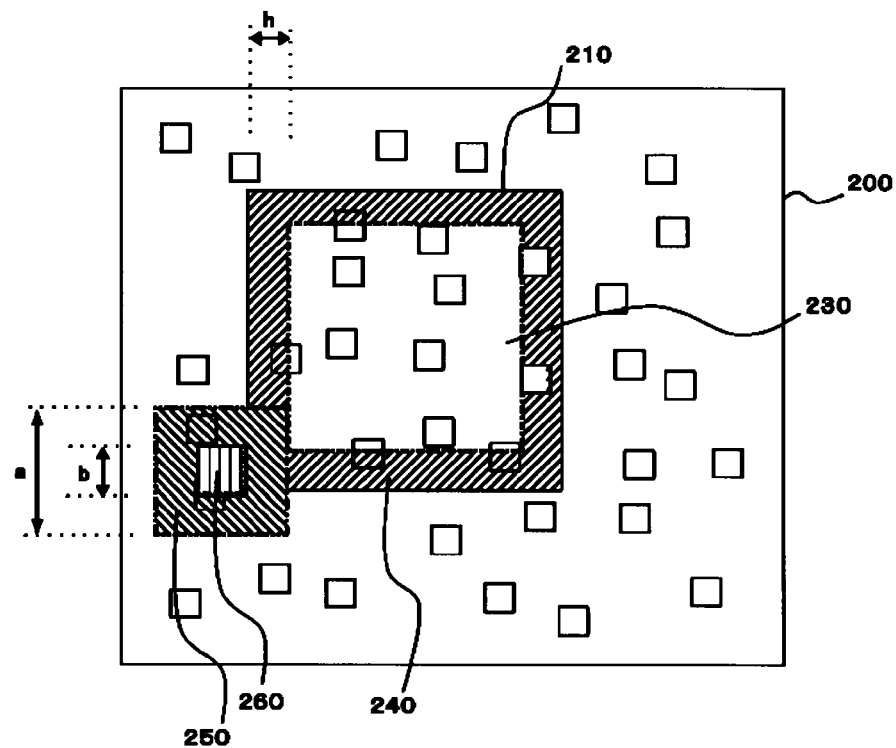
FIG. 4 is a layout diagram showing an area objected to the verification of the mask pattern verification method according to the first embodiment.

Next, a mask pattern verification method by using the mask pattern verification apparatus mentioned above is explained as reference to FIGS. 3, 4. FIG. 3 is a flow chart showing a mask pattern verification method according to the first embodiment. FIG. 4 is a layout diagram showing an area objected to the verification of the mask pattern verification method, which is described in step 2 mentioned below, according to the first embodiment.

Kinds of patterns are existed in the circuit patterns. Mask pattern verification according to this embodiment can be applied to each of the mask patterns. In this case for simplification, a design circuit pattern set to be a contact pattern is illustrated in this embodiment and the mask pattern verification method is explained.

First, a design circuit pattern is input into the design circuit pattern memory portion 60 by the input portion 20 in step S101.

Next, the design circuit pattern 200 is read to the temporary memory pattern portion 110 by using the pattern matching circuit 12 of the CPU 10 and the clean circuit pattern 210 is read to the library registration portion 70 in step S102. The circuit pattern corresponding to the clean circuit pattern 210 being set to be in the design circuit pattern 200 or not is verified by adapting the design circuit pattern 200 to the clean circuit pattern 210.

As shown in FIG. 4, when the clean circuit pattern 210 is set to be in the design circuit pattern 200 in step S102, the process goes to step S106. An area subtracted the periphery area with the prescribed width from the clean circuit pattern 210 is defined as the reference circuit pattern 230 by the verification circuit pattern extraction circuit 13 in step S106. The OPC treatment is not performed to the reference circuit pattern 230. As shown in FIG. 2, the area subtracted the reference circuit pattern 230 from the design circuit pattern 200, which is described as the diagonal lines in FIG. 2, is defined as the verification circuit pattern 220. The verification circuit pattern 220 is saved in the verification circuit pattern memory portion 80 by the verification circuit pattern extraction circuit 13.

Here, a periphery area 240 with the prescribed width is determined by a relationship between an optical calculation area 250 optically calculated and an adoption area 260 in the optical calculation as shown in FIG. 4. Here, an area optically calculated for performing OPC in the adoption area 260 is defined as the optical calculation area 250.

For example, the optical calculation area 250 is set to be a square with a side of length a, and the adoption area 260 is set to be a square with a side of length b. In this case, the prescribed width is set to be (a-b) which is the difference between the sides of the two squares. As shown in FIG. 4, The (a-b) is set to be a distance h which is the distance between the side of the adoption area 260 and the side of the optical calculation area 250. The periphery area 240 is determined by the distance h. The periphery area 240 is a range determined by shifting the adoption area 260 along the outer periphery of the clean circuit pattern 210 as not to overlap to the clean circuit pattern. The distance h is smaller than half of the side of the clean circuit pattern. Further, shapes of both the calculation area 250 and the adoption area 260 may be arbitrary.

Furthermore, the sides of the optical calculation area 250 and the adoption area 260 can be arbitrarily designed. On the other hand, the distance h mentioned above is determined to attain trouble-free OPC accuracy fabricating semiconductor devices.

When the clean circuit pattern 210 is not set to be in the design circuit pattern 200, a step is performed as below in step S103. Whole area of the design circuit pattern 200 as the verification circuit pattern 220 which is objected to OPC is saved in the verification circuit pattern memory portion 80 by the verification circuit pattern extraction circuit 13.

Next, OPC is carried out to the verification circuit pattern 220 by the OPC circuit 14 in step S104. The verification mask pattern is saved in the verification mask by the pattern memory portion 90.

Next, mask verification is carried out to the verification mask pattern in operating the mask verification portion 40 by the mask verification circuit 15. When the verification mask pattern has a defect in mask verification, adjusting OPC or not is judged in step S107. When adjusting OPC, OPC is performed in step S108. Successively, OPC is again carried out to the verification circuit pattern 220.

On the other hand, when adjusting OPC is not carried out in the judge of step S107, the process goes to step S109. After the design circuit pattern 200 in the design circuit pattern memory portion 60 is corrected in step S109, the process returns step S101, the steps mentioned above are performed to step S104. Specifically, the circuit pattern corresponding to the clean circuit pattern 210 being set or not in the corrected design circuit pattern 200 is verified in step S102. The verification circuit pattern 220 objected to perform OPC is again defined by the verification circuit pattern extraction circuit 13.

When the clean circuit pattern 210 is set to be in the corrected design circuit pattern 200, an area other than periphery area 240 with the prescribed width in the clean circuit pattern 210 is defined as the reference circuit pattern 230 in step S106. Further, an area other than the reference circuit pattern 230 in the corrected design circuit pattern 200 is defined as the verification circuit pattern 220, and is extracted by the verification circuit pattern extraction circuit 13. Further, the verification circuit pattern 220 is saved in the verification circuit pattern memory portion 80. When the clean circuit pattern is not set to be in the design circuit pattern, a whole area of the corrected design circuit pattern 200 is defined as the verification circuit pattern 220 objected to perform OPC and is extracted by the verification circuit pattern extraction circuit 13 in step S103. Further, the verification circuit pattern 220 is saved in the verification circuit pattern memory portion 80.

Successively the verification circuit pattern 220 in the corrected design circuit pattern 200 is performed to OPC treating by the OPC circuit 14 in step S104. Mask verification is performed to the verification mask pattern read out from the readout circuit 18 by operating the mask verification portion 40 using the mask verification circuit 15 in step S104.

The verification mask pattern performed mask verification in step S104 as mentioned above. The steps are repeated till judging the verification mask pattern not to have a defect. As a result, a pattern for adapting mask verification is adjusted.

Next, lithography simulation is performed to the verification mask pattern read from the readout circuit 18 by the lithography simulation circuit 16 in step S105. Subsequently, lithography verification is performed to a verification wafer pattern which has a hot spot or not in operating the lithography verification portion 50 by the lithography verification circuit 17.

When the hot spot is detected in the verification wafer pattern in step S105, the design circuit pattern 200 in the design circuit pattern memory portion 60 is corrected and the process is returned step S101 where the corrected design circuit pattern 200 is input into the memory portion 60. The steps are repeated from step S101 to step S104 till the hot spot not to be extracted in the verification mask pattern is judged. In such a manner, the mask pattern adapted to lithography verification is obtained from the readout circuit 18.

In such a manner, the process amount in mask pattern verification can be decreased by not to perform mask verification and lithography verification to the reference circuit pattern in the clean circuit pattern. Consequently, the mask pattern verification apparatus and mask pattern verification can be provided as a method for shortening the verification TAT. Further, OPC by the OPC circuit 14 and lithography simulation by the lithography simulation circuit 16 to a range of the reference circuit pattern in the clean circuit pattern, therefore, verification TAT can be shortened.

When the optical calculation area 250 and the adoption area 260 are determined in this embodiment, the sides of the optical calculation area 250 and the adoption area 260 is arbitrarily assigned by the OPC circuit 14. On the other hand, a method for arbitrarily changing the side length may be set in the CPU 10.

In such a manner, the prescribed width of the periphery area determined by the optical calculation area 250 and the adoption area 260 can be decreased as less as possible. Accordingly, a range of the reference circuit pattern in the design circuit pattern can be larger as much as possible, and a range of the verification circuit pattern can be smaller as less as possible. As a result, the verification TAT can be shortened.

The clean circuit pattern registered in the library registration portion 70 being set to be or not in the design circuit pattern input by the design circuit pattern memory portion 60 is verified in the mask pattern verification method in this embodiment. On the other hand, a portion of the clean circuit pattern registered in the library registration portion 70 may be again registered as a second clean circuit pattern. In this case, the second clean circuit pattern is set to be or not in the design circuit pattern can be verified by using the second clean circuit pattern. The design circuit pattern corresponding to the mask pattern finally output may be used in the mask pattern verification method in this embodiment. In this case, this clean circuit pattern being set or not in the design circuit pattern can be verified.

In such a manner, the clean circuit pattern corresponded by pattern matching circuit 12 can be increased in the design circuit pattern. As a result, a range of the verification circuit pattern can be decreased to shorten the verification TAT.

A plurality of identical circuit patterns which are not the clean circuit pattern are extracted in the first embodiment. In this case, the circuit pattern is selected from the plurality of identical circuit patterns by the verification circuit pattern extraction circuit 13. A whole of the selected circuit pattern is included in the verification circuit pattern. On the other hand, each of the plurality of the circuit patterns other than the selected circuit pattern in the plurality of the identical circuit patterns is subtracted the reference circuit pattern, and is included in the verification circuit pattern. The mask pattern verification method may be applied to the verification circuit pattern.

In such a manner, a verification range is decreased. As a result, the verification TAT can be shorter.

Second Embodiment

A mask pattern verification apparatus according to a second embodiment will be explained. The mask pattern verification apparatus according to the second embodiment is different from the mask pattern verification apparatus according to the first embodiment as mentioned below. The plurality of the identical clean circuit patterns are set to be in the design circuit patterns and the plurality of identical clean circuit patterns are hierarchically distinguished to be saved in the verification pattern memory portion 80. On the other hand, other constitutions in the second embodiment are identical with the constitutions in the first embodiment. Accordingly, explanations in the second embodiment are omitted on similar or same constitutions with the first embodiment, and the different constitutions are explained as mentioned below.

<Verification Apparatus>

A plurality of identical clean circuit patterns in the design circuit patterns are set to be in the verification circuit pattern memory portion 80 of the mask pattern verification apparatus, and a plurality of clean circuit patterns are distinguished to be hierarchically saved in identical clean circuit patterns.

One clean circuit pattern is selected from the identical clean circuit patterns, each having an identical periphery circuit pattern in the design circuit pattern. The selected clean circuit pattern is called a selection clean circuit pattern hereinafter. The clean circuit patterns other than the selection clean circuit pattern in the clean circuit patterns are defined as the non-selection clean circuit patterns. The selection clean circuit pattern and the non-selection clean circuit patterns are distinguished each other, and are hierarchically saved in the verification circuit pattern memory portion 80.

Figure 5:
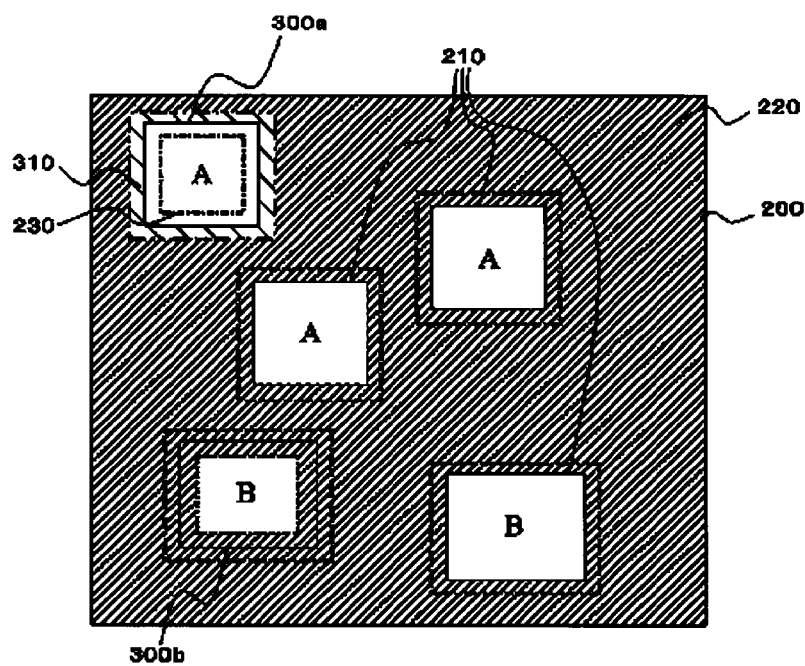
FIG. 5 is a conceptual diagram showing a circuit pattern saved in a pattern memory portion according to a second embodiment.

As shown in FIG. 5, a periphery circuit pattern 310 is a range determined by configuring the optical calculation area 250 to the clean circuit pattern 210 along an outer periphery of the clean circuit pattern 210 and shifting not to overlap to the clean circuit pattern 210. FIG. 5 is a conceptual diagram showing a circuit pattern saved in a pattern memory portion according to a second embodiment. For simplifying the drawings, diagonal lines 310 in the figure are attached only one of the clean circuit pattern A, and omitted to another clean circuit patterns.

As shown in FIG. 5, two kinds of clean circuit patterns A, B are set to be in the design circuit patterns, for example, three of clean circuit patterns A, two of clean circuit patterns B. One of the three clean circuit patterns A and one of the two clean circuit patterns B are saved in the verification circuit pattern memory portion 80 as a selection clean circuit pattern 300a and a selection clean circuit pattern 300b by the verification circuit pattern extraction circuit 13, respectively. Another three clean circuit patterns are saved in the verification circuit pattern memory portion 80 as the non-selection clean circuit patterns.

A range of each circuit pattern subtracted the reference circuit pattern from the selection clean circuit patterns 300a, 300b, respectively, are performed OPC by the OPC circuit 14, mask verification by the mask verification circuit 15, lithography simulation by the lithography simulation circuit 16, and lithography verification by the lithography verification circuit 17. On the other hand, a range of the non-selection clean circuit patterns are not performed OPC, mask verification, lithography simulation, and lithography verification mentioned above.

<Mask Pattern Verification Method>

Figure 6:
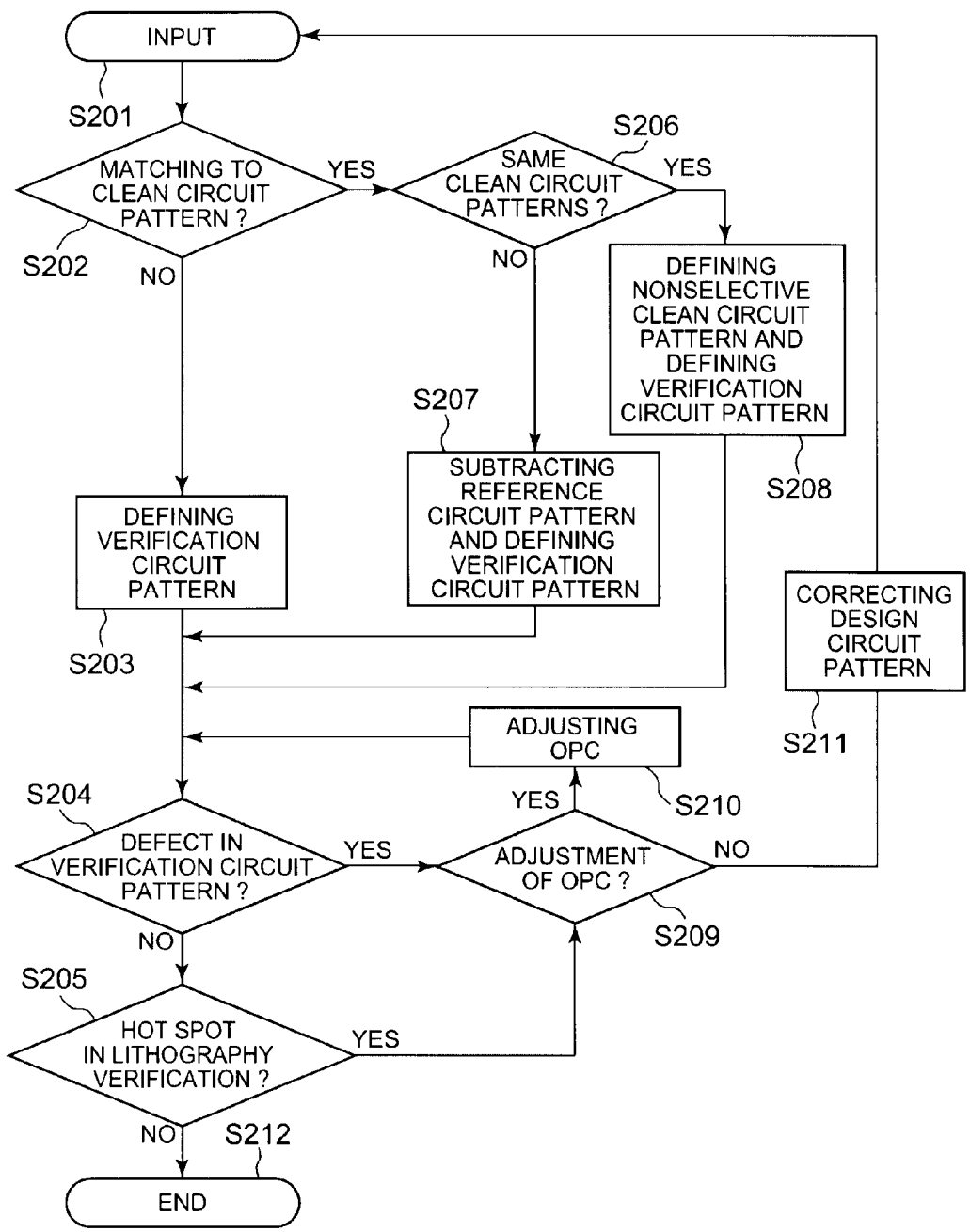
FIG. 6 is a flow chart showing a mask pattern verification method according to the second embodiment.

The mask pattern verification method by the mask pattern verification apparatus mentioned above is explained by using FIG. 6. FIG. 6 is a flow chart showing a mask pattern verification method according to the second embodiment.

When the plurality of the identical clean circuit patterns are set to be in the design circuit pattern, the identical clean circuit patterns are hierarchically distinguished to be saved in the verification circuit pattern memory portion 80 in the mask pattern verification method according to the second embodiment. This point in the second embodiment is different from the method of the first embodiment. On the other hand, other verification methods of the second embodiment are identical with those of the first embodiment.

Accordingly, explanations in the second embodiment are omitted on similar or same methods with the first embodiment, and the different methods are explained as mentioned below.

As shown in FIG. 6, the design circuit pattern is input into the design circuit pattern memory portion 60 by the input portion 20 in step S201. The circuit pattern corresponding to the clean circuit pattern registered in the library registration portion 70 being set to be or not in the design circuit pattern of the design circuit pattern memory portion 60 is verified by the pattern matching circuit 12 of the CPU 10 in step S202.

When the clean circuit pattern is set to be in the design circuit pattern in step S202, the process shift to step S206. On the other hand, each of the identical clean circuit patterns having the identical periphery circuit pattern are not set to be in the design circuit pattern in step S202, namely, the identical clean circuit pattern set to be as one, the process goes to step S203 as the same as the first embodiment. A range other than the periphery area with the prescribed width in the clean circuit pattern is defined as the reference circuit pattern, and extracted by the verification circuit pattern extraction circuit 13 in step S203. The reference circuit pattern is not performed to OPC treatment. As shown in FIG. 6, the verification circuit pattern other than the reference circuit pattern in the design circuit pattern is extracted by the verification circuit pattern extraction circuit 13 to be saved in the verification circuit pattern memory portion 80.

Here, a case including the plurality of the identical clean circuit pattern having the identical periphery circuit patterns is defined as mentioned below. First, one kind of the clean circuit pattern is set to be as one pattern. Secondly, each of the plurality of the clean circuit patterns is set to be as one pattern, respectively. For example, the clean circuit patterns on the clean circuit patterns A, B as shown in FIG. 5 are mentioned below. First, the case is described that one of the clean circuit pattern A is extracted and the clean circuit pattern B is not extracted. On the other hand, secondly, another case is described that one of the clean circuit pattern A is extracted and one of the clean circuit pattern B is extracted.

When the clean circuit pattern is set to be in the design circuit pattern in step S202, the process shifts to step S206. When the plurality of the identical clean circuit patterns, each having the identical periphery circuit pattern, are existed in the design circuit pattern in step S206, the process shifts to next step S208. One of the clean circuit patterns is extracted as the selection clean circuit pattern by the verification circuit pattern extraction circuit 13 in step S208 to be saved in the verification circuit pattern memory portion 80. The clean circuit pattern other than the selection clean circuit pattern in the clean circuit patterns is extracted as the non-selection clean circuit pattern. The selection clean circuit pattern and the non-selection clean circuit patterns are distinguished to be hierarchically saved in the verification circuit pattern memory portion 80.

OPC is not carried out to the reference circuit pattern and the non-selection clean circuit pattern of the selection clean circuit pattern. A range subtracted the reference circuit pattern and the non-selection clean circuit pattern in the selection clean circuit pattern from the design circuit pattern is extracted as the verification circuit pattern objected to be performed OPC by the verification circuit pattern extraction circuit 13 to be saved in the verification circuit pattern memory portion 80.

When the clean circuit pattern is not set to be in the design circuit pattern in step S202, a whole area of the design circuit pattern in the design circuit pattern memory portion 60 is extracted as the verification circuit pattern objected to be performed OPC by the verification circuit pattern extraction circuit 13 in step S203. The verification circuit pattern is saved in the verification circuit pattern memory portion 80.

Next, OPC is performed to the verification circuit pattern by the OPC circuit 14 from the readout circuit 18 in step S204. The verification mask pattern is read out to be saved in the verification mask pattern memory portion 90.

Further, mask verification is performed to the verification mask pattern in operating the mask verification portion 40 by the mask verification circuit 15 in step S204. When the verification mask pattern includes a defect in mask verification, adjusting OPC is judged in step S209. When adjusting OPC, OPC is again performed to the verification circuit pattern in step S210. Further, the adjusted OPC algorithm is different from the OPC algorithm before adjusting.

When not adjusting OPC, the design circuit pattern in the design circuit pattern memory portion 60 is corrected in step S211. Further, returning step S201, the corrected design circuit pattern is input into the design circuit pattern memory portion 60 to process till step S203.

The steps from step S1 to step S4 is repeatedly performed till judging as the corrected verification mask pattern having no defect by the mask verification circuit 15 in step S204. In such a manner, the pattern correction adapted to mask verification is performed.

When the verification mask pattern has not a defect in mask verification in step S204, lithography simulation is performed to the verification mask pattern by the lithography simulation circuit 16 in step S205, after mask verification. Further, lithography verification is carried out to the verification wafer pattern in operating the lithography verification portion 50 by the lithography verification circuit 16.

When a hot spot is extracted in the verification wafer pattern by the lithography verification in step S205, adjusting OPC is judged in step S209. When adjusting OPC is performed, OPC is adjusted in step S210. On the other hand, when OPC is not performed, the design circuit pattern in the design circuit pattern memory portion 60 is corrected in step S211. Further, returning step S201, the corrected design circuit pattern is again input into the design circuit pattern memory portion 60, the steps from step S201 to step S204 are repeatedly performed.

The steps from step S201 to step S204 is repeated performed till judging verification wafer pattern having no hot spot in lithography verification in step S205. In such a manner, the mask pattern which can form the wafer pattern adapted to lithography verification is obtained from the readout circuit 18.

As mentioned above, the process amount in the mask pattern verification can be decreased by not to perform mask verification and lithography verification to the reference circuit pattern and the non-selection clean circuit pattern in the selection clean circuit pattern. Consequently, the mask pattern verification apparatus and mask pattern verification can be provided as a method for shortening the verification TAT.

The selection clean circuit pattern and the non-selection clean circuit pattern are distinguished to be hierarchically saved in the verification circuit pattern memory portion 80 in this embodiment. Accordingly, OPC and lithography simulation are not necessary to be performed to the range of the non-selection clean circuit pattern as compared to the first embodiment, so that the TAT can be shortened.

Figure 7:
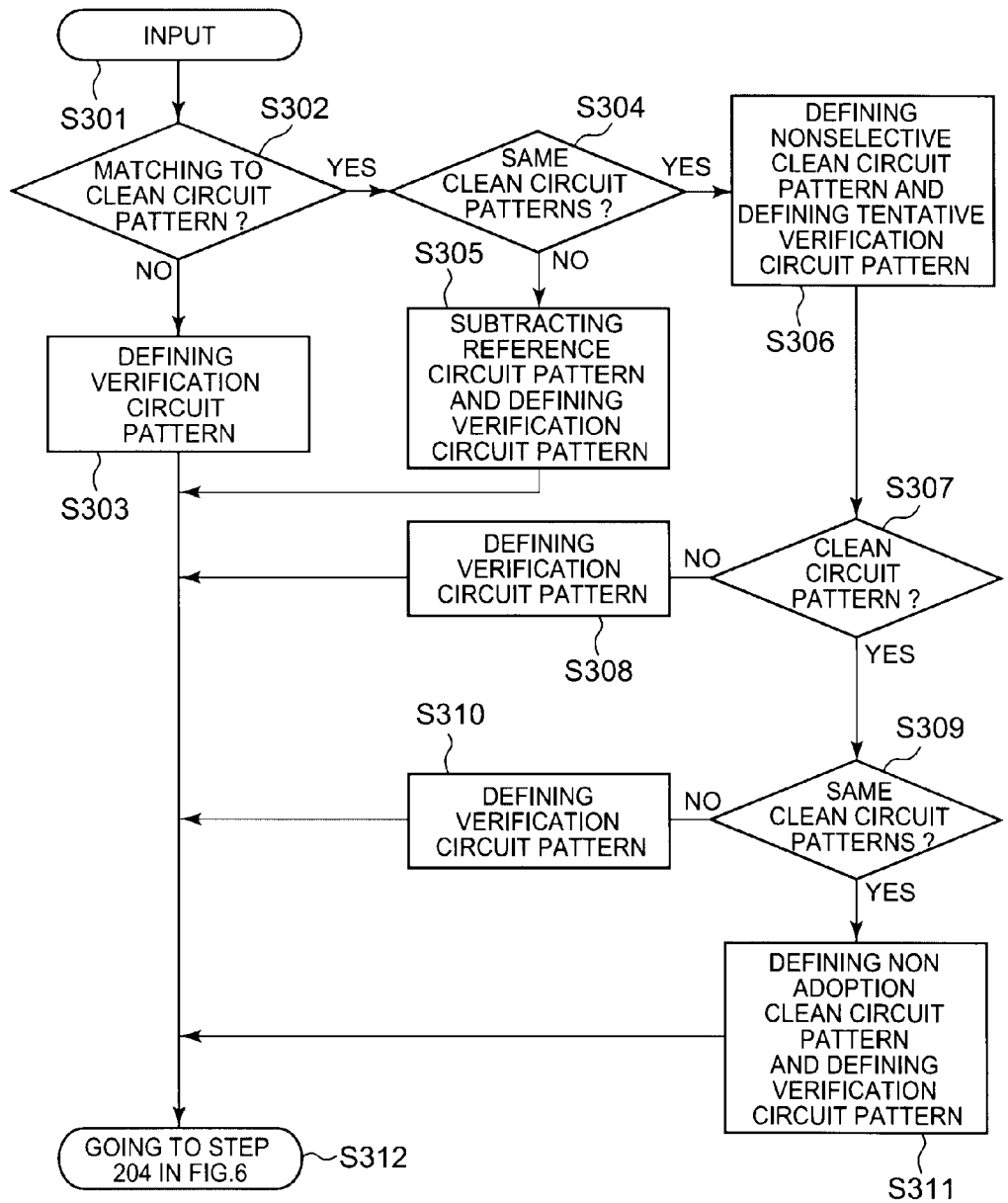
FIG. 7 is a flow chart showing a mask pattern verification method according to a modification of the second embodiment.

Next, a modification of the second embodiment is demonstrated. FIG. 7 is a flowchart showing a mask pattern verification method according to the modification of the second embodiment. Explanation on the modification in detail is omitted as mentioned below, for example, only steps S301-S306, which are different from the second embodiment, are explained.

When the identical clean circuit patterns, each having identical periphery circuit pattern, in the identical clean circuit pattern, and the identical clean circuit pattern having non-identical periphery circuit pattern are extracted by the verification circuit pattern extraction circuit 13 in the modification, as shown step S307 in FIG. 7, the identical clean circuit patterns having the identical periphery circuit pattern are distinguished as the selection clean circuit pattern to be hierarchically saved in the verification circuit pattern memory portion 80 as the same as the second embodiment. On the other hand, the identical clean circuit pattern having the non-identical periphery circuit pattern may be extracted the verification circuit pattern subtracted the reference circuit pattern in the identical clean circuit pattern having the non-identical periphery circuit pattern as the same as the first embodiment. When the identical clean circuit pattern having the non-identical periphery circuit pattern is extracted in step S309, the adoption circuit pattern and the non-adoption circuit pattern are distinguished to be hierarchically saved and be extracted verification circuit pattern in step S301. Here, the adoption circuit pattern defined as a circuit pattern adopted from circuit patterns having the periphery circuit pattern. On the other hand, the non-adoption circuit pattern is a portion of the circuit pattern other than the non-adoption circuit pattern in the identical clean circuit patterns having the non-identical periphery circuit pattern.

In such a manner, a verification range is decreased. As a result, the verification TAT can be shortened.

When the identical clean circuit patterns having the identical periphery circuit pattern are extracted, the selection clean circuit pattern and the non-selection clean circuit pattern are hierarchically saved in this embodiment. When the identical circuit patterns other than the clean circuit pattern having the identical periphery circuit pattern, the selection circuit pattern which is one circuit pattern selected from identical circuit patterns having identical periphery circuit patterns and the non-selection circuit pattern other than the selection circuit pattern may be hierarchically saved in the verification circuit pattern memory portion 80. A whole area of the selection circuit pattern is included in the verification circuit pattern, and the verification circuit pattern subtracted the non-selection circuit pattern may be extracted.

In such a manner, a verification range is decreased. As a result, verification TAT can be shortened.

Third Embodiment

<Method of Fabricating a Semiconductor Device>

A method of fabricating a semiconductor device using the mask pattern verification according to a third embodiment is explained. For simplification of explanation, only the process for transferring the mask pattern obtained by the first embodiment and the second embodiment.

In the library registration portion, not only the clean circuit pattern but also the clean mask pattern corresponding to the clean circuit pattern are registered by the library registration circuit 11.

A mask is fabricated using a synthetic mask pattern which is composed of a portion of a clean mask pattern corresponding to a range of the reference circuit pattern to a mask pattern obtained in the first embodiment and the second embodiment. A resist is coated on a surface of a wafer to transfer a mask pattern adapted to mask verification and lithography verification. The kind of the resist can be arbitrarily selected. After coating the resist, lithography is performed to the wafer through the mask using a lithography apparatus to optically transfer the mask pattern on the wafer.

As mentioned above, the method of fabricating a semiconductor device using the mask pattern verification method which is capable of shortening the verification TAT can be provided.

The synthetic mask pattern which is composed of a portion of the clean mask pattern corresponding to a range of the reference circuit pattern to the mask pattern obtained in the first embodiment and the second embodiment is used in this embodiment. As a result, the synthetic mask pattern can be immediately obtained after mask pattern verification, which leads to decrease fabricating TAT of semiconductor devices.

While certain embodiments have been described, these embodiments have been presented by way of example only, and are not intended to limit the scope of the inventions. Indeed, the novel methods and apparatuses described herein may be embodied in a variety of other forms; furthermore, various omissions, substitutions and changes in the form of the methods and apparatuses described herein may be made without departing from the spirit of the inventions. The accompanying claims and their equivalents are intended to cover such forms or modifications as would fall within the scope and spirit of the inventions.

What is claimed is:

1. A mask pattern verification apparatus, comprising:
a library registration portion registered a clean circuit pattern;
a memory portion saved a design circuit pattern, a verification circuit pattern, a verification mask pattern, and a verification wafer pattern;
a mask verification portion performing mask verification to the verification mask pattern;
a lithography verification portion performing lithography verification to the verification wafer pattern; and
a CPU including a library registration circuit registering the clean circuit pattern to the library registration portion,
a pattern matching circuit verifying the clean circuit pattern being set or not in the design circuit pattern,
a verification pattern extraction circuit extracting the verification circuit pattern from the design circuit pattern,
an OPC circuit performing OPC to the verification circuit pattern;
a mask verification circuit controlling the mask verification portion, and
a lithography verification circuit controlling the lithography verification portion.

2. The apparatus of claim 1, wherein
a periphery area of the clean circuit pattern has a prescribed width, and the prescribed width is smaller than a half of the shortest side length of the clean circuit pattern.

3. The apparatus of claim 1, wherein
the verification circuit pattern includes the periphery area, and the CPU includes a control circuit which arbitrarily changes the prescribed width.

4. A method of verifying a mask pattern, comprising:
registering a clean circuit pattern in a library registration portion;
verifying the clean circuit pattern being set in a design circuit pattern in a design circuit pattern memory portion by pattern-matching;
extracting a verification circuit pattern from the design circuit pattern to save in a verification circuit pattern memory portion;
performing OPC treatment to the verification circuit pattern to obtain a verification mask pattern;
performing mask verification to the verification mask pattern;
performing lithography simulation to the verification mask pattern to obtain a verification wafer pattern;
verifying the verification wafer pattern to obtain a mask pattern adapted to the lithography verification.

5. The method of claim 4, wherein
a periphery area of the clean circuit pattern has a prescribed width, and the prescribed width is smaller than a half of the shortest side length of the clean circuit pattern.

6. The method of claim 4, wherein
in verifying the clean circuit pattern by the pattern-matching, one of first clean circuit patterns, each of the first clean circuit patterns is identical in shape, in the clean circuit patterns in the design circuit pattern is defined as a selection clean circuit pattern where each of periphery circuit patterns in each of the first clean circuit patterns is identical in shape, the clean circuit patterns other than the selection clean circuit pattern is defined as non-selection clean circuits patterns, and the selection clean circuit pattern and the non-selection clean circuits pattern are saved in a verification circuit pattern memory portion.

7. The method of claim 4, wherein
in extracting a verification circuit pattern, a reference circuit is subtracted a portion from the design circuit pattern, where the portion is subtracted a periphery area with a prescribed width from the clean circuit pattern.

8. The method of claim 4, further comprising:
registering a clean mask pattern corresponding to the clean circuit pattern in the library registration portion.

9. The method of claim 4, further comprising:
performing OPC treatment to the verification mask pattern after the mask verification.

10. The method of claim 4, further comprising:
performing OPC treatment to the verification mask pattern after performing the lithography verification.

11. The method of claim 4, further comprising:
correcting the design circuit pattern after the lithography verification is performed.

12. The method of claim 4, further comprising:
registering a portion of the clean circuit pattern as a partial clean circuit pattern, and verifying the partial clean circuit pattern which is set in the design circuit pattern.

13. The method of claim 4, further comprising:
extracting a plurality of identical non-clean circuit patterns which is not the clean circuit pattern in the design circuit pattern and selecting one selection circuit pattern from the identical non-clean circuit patterns.

14. The method of claim 13, wherein
whole selection circuit pattern is included in the verification circuit pattern.

15. The method of claim 13, wherein
a non-selection clean circuit pattern which is subtracted the reference circuit pattern from the non-clean circuit pattern other than the selection circuit pattern is included in the verification circuit pattern.

16. The method of claim 15, wherein
the selection circuit pattern and the non-selection circuit pattern are hierarchically distinguished to be saved in the verification circuit pattern memory portion.

17. A method of fabricating a semiconductor device, comprising:
registering a clean mask pattern corresponding to clean a circuit pattern in a library registration portion;
forming a mask using a synthetic mask pattern compositing a mask pattern verified by the mask pattern verification method in claim 5 and a portion of the clean mask pattern corresponding to a range of a reference circuit pattern in the clean circuit pattern; and
coating a resist on a wafer and transferring the composition pattern on the wafer through the mask.

* * * * *